CRYOGENIC DEVICE EMPLOYING SUPERCONDUCTIVE ALLOYS

Filed June 29, 1962 2 Sheets-Sheet 1

CRITICAL TEMPERATURE OF INDIUM-MERCURY ALLOYS

INVENTORS
MATTHEW J. BURNS
ARNOLD M. TOXEN
BY S. P. Tedesco
ATTORNEY

THICKNESS≅2500 Å

3,215,967
CRYOGENIC DEVICE EMPLOYING SUPERCONDUCTIVE ALLOYS

Matthew J. Burns, Poughkeepsie, and Arnold M. Toxen, Peekskill, N.Y., assignors to International Business Machines Corporation, New York, N.Y., a corporation of New York Filed June 29, 1962, Ser. No. 206,222
13 Claims. (Cl. 338—32)

This invention relates to cryogenic devices and, more particularly, to cryogenic devices fabricated of superconductive alloys.

Basically, the operation of cryogenic devices is based on the physical phenomenon of superconductivity which is that property of certain metals to exhibit no electrical resistance below a critical transition temperature, the critical temperature being characteristic of the particular metal and ranging between 0.1° Kelvin and 17° Kelvin (degrees centigrade above absolute zero). While maintained below this critical temperature, the superconductive properties of these metals are destroyed by a sufficiently strong magnetic field, either externally applied or internally generated by current flowing along the metal as a conductor. The value of external magnetic field required to destroy superconductivity and revert the metal to a normal or resistive state is termed the critical field; the critical field is greatest at 0° Kelvin and decreases to zero at the critical transition temperature. Since a superconductive metal when artificially refrigerated below its critical temperature can exhibit two distinct states, i.e. normally resistive when subjected to a critical magnetic field or superconductive, components formed of such metals can be used as unique electrical switches to define binary quantities for memory applications.

Most recently, components formed of superconductive metals or "cryotrons" have been fabricated in the form of thin strips or films laid down in laminate fashion onto either a cylindrical or planar substrate, the latter being preferred due to its greater adaptability for mass production techniques. A cryotron of the latter type is, for example, described in the copending patent application of Richard L. Garwin, Ser. No. 625,512, filed on Nov. 30, 1956, and assigned to the same assignee as this invention. Such cryotrons are formed over a superconductive magnetic shield by the superdeposition through appropriate masking plates and in vacuum of a thin film of a first superconductive metal, i.e. a control conductor, in magnetic field applying relationship to a thin film of a second superconductor metal, i.e. a gate conductor, having a lower critical temperature than the first metal. Magnetic fields generated by current flow along the control conductor are sufficient to destroy superconductivity in the gate conductor material.

Limiting operational parameters of cryotrons are necessarily determined by the particular characteristics of the superconductive metals of which they are formed. Parameters of particular interest are the speed with which a cryotron or, more particularly, the gate conductor switches between superconductive and normal states and also the value of the critical magnetic field necessary to effect such transition. For computer applications, very fast transitional speeds between superconductive and normal states are extremely desirable so as not to limit the operational speed of a computer system; also, reducing critical field results in a corresponding reduction in the power consumption of the cryogenic circuit array or system. To render cryotrons practical for computer applications, therefore, superconductive metals forming such cryotrons must be judiciously selected.

The switching time of a cryotron between superconductive and normal states is inversely related to the normal resistance of the metal forming the gate conductor. It is generally known that alloys formed of superconductive metals exhibit superconductive properties and a normal resistance larger than that of either of the constituent metals. Also, superconductive metals exhibit increased resistance wherever impurities such as gas have been dissolved into the material. Investigations of bulk superconductive alloys have been reported, for example, by R. G. Chambers, Proceedings of the Royal Society, A–215 (1952) and by A. B. Pippard, Proceedings of the Royal Society (London) A216, 547 (1953). It was once believed that switching speeds of cryotrons could be substantially increased by forming the gate conductor of a superconductive alloy. However, it was soon discovered that the particular superconductive alloys investigated, while exhibiting increased normal resistance, also exhibited an increased penetration depth $\lambda$. Penetration depth $\lambda$ defines stored field within a superconductive specimen tending to maintain current flow therealong and, therefore, is a measure of internal inductive effects tending to inhibit the switching of such specimen between superconductive and normal states. The switching time of a cryotron, therefore, is also directly related to penetration depth $\lambda$. For example, Pippard in his work on tin-base alloys showed that penetration depth $\lambda$ (which is also a measure of required critical field) varies substantially linearly with incerased resistivity due to alloying. Therefore, advantages to be gained in forming the cryotron, i.e. gate conductor, of a superconductive alloy would be somewhat negated as a larger magnitude of critical field would be required to destroy superconductivity therealong due to the accompanying increase in penetration depth $\lambda$. The increased magnitude of critical field required to destroy superconductivity in alloys of low solute concentrations is tolerable; however, for alloys of higher solute concentrations, the magnitude of critical fields required to achieve switching speeds comparable with those of pure metals would be excessive and, therefore, full advantage has not been made heretofore of the increased resistance of superconductive alloys. It has long been appreciated that but for the substantially large increase in penetration depth $\lambda$ for large solute concentrations, superconductive alloys could be more advantageously employed in lieu of the pure superconductive metals.

This invention, therefore, has as its principal object the fabrication of a thin film cryotron for computer applications having very fast switching speeds.

Another object of this invention is to provide a practical thin film cryotron wherein the gate conductor is formed of a superconductive alloy.

Another object of this invention is to provide a thin film cryotron device wherein the gate conductor is formed of a superconductive alloy characterized in that the normal resistance due to alloying increases at a proportionately faster rate than does the accompanying increase in peneration depth $\lambda$ (stored field) whereby inductive effects are minimized.

Another object of this invention is to provide a thin film cryotron wherein the gate conductor is formed of a superconductive alloy exhibiting gain characteristics substantially the same as when the pure alloy-base material is employed.

What has been discovered is that certain alloys when formed in thin films as distinguished from bulk specimens, while exhibiting an expected increase in resistivity with composition, are distinguishable in that such increase in resistivity is accompanied by only a modest increase in penetration depth $\lambda$ (stored field). Thin films of these alloys have been observed to exhibit a normal resistance which is up to 1200% greater than that exhibited by a bulk specimen of the pure alloy-base metal with an accompanying increase in penetration depth $\lambda$ of only approximately 35%. Due to this proportionately greater increase in normal resistance over that of penetration depth λ (stored field), internal inductive effects of thin film cryotrons having gate conductors formed of these superconductive alloys are very much less than normally expected and provide, together with the large increased normal resistance, faster switching speeds in cryogenic circuits than possible when thin films formed of the pure base metal are employed. Moreover, as thin film cryotrons comprising gate conductors formed of these certain superconductive alloys and those formed of the pure alloy-base metal exhibit substantially the same gain characteristics, a substantially same value of critical field is required whereby power consumption in the cryogenic circuit is maintain substantially constant.

The foregoing and other objects, features and advantages of the invention will be apparent from the following more particular description of preferred embodiments of the invention, as illustrated in the accompanying drawings.

Figure 1:
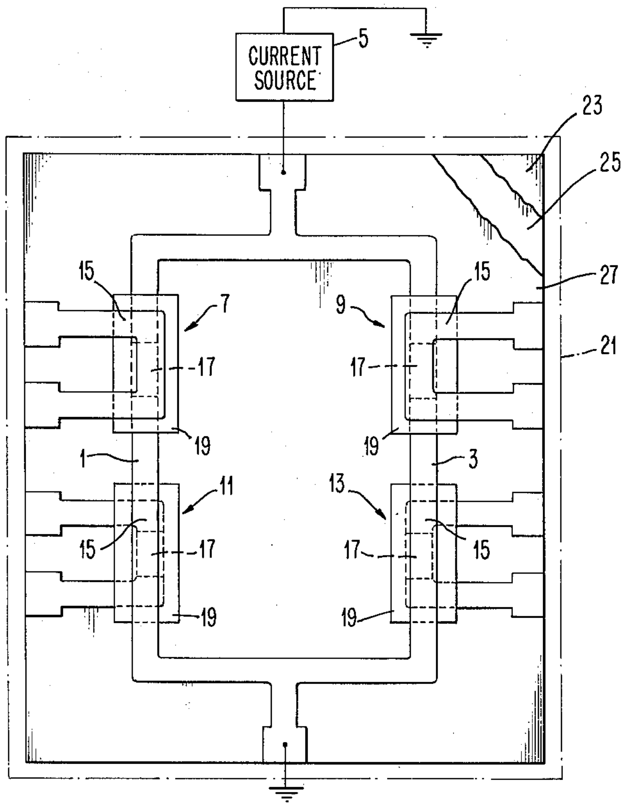
FIG. 1 illustrates a cryotron circuit arrangement wherein the individual gate conductors are formed of superconductive alloys in accordance with the principles of this invention.

To particularly define the numerous benefits to be achieved by forming cryotrons in accordance with the principles of this invention, reference is initially made to FIG. 1 wherein a cryotron bistable circuit arrangement is illustrated. The circuit arrangement of FIG. 1 comprises two thin film strip conductors 1 and 3 defining a cryogenic loop and formed of hard superconductive materials, e.g. lead, except for electrically-integral segments of soft superconductive materials forming the gate conductors of input cryotrons 7 and 9, respectively. Sensing cryotrons 11 and 13 utilize a segment of strip conductors 1 and 3, respectively, as control conductors; as hereinafter described, sensing cryotrons 11 and 13 sense current flow along strip conductors 1 and 3, respectively, so as to ascertain the state of the circuit arrangement.

The cryotrons illustrated in FIG. 1 are of the inline type and each includes a control conductor 15 arranged in magnetic field applying relationship to a gate conductor 17 of a soft superconductive alloy, the selection of such alloy being hereinafter fully described; the gate and control conductor forming each cryotron are electrically insulated by a thin film 19 of dielectric material, e.g. SiO. The entire circuit arrangement is normally artificially refrigerated below the critical temperature of the superconductive alloy by a cryostat arrangement represented by dotted enclosure 21. Accordingly, conductors 1 and 3 define alternate current paths from current source 5 to ground which are normally resistanceless but for gate conductors 17 of input cryotrons 7 and 9, respectively. Resistance is introduced segmentally along either of strip conductors 1 and 3 by energizing control conductor 15 of one of the input cryotrons 7 and 9, respectively, to switch the associated gate conductor 17 to a normal resistive state. As the other of the strip conductors 1 and 3 is resistanceless, reversion of the gate conductor 17 to a normal resistive state forces all current from source 5 to flow along the other strip conductor to ground.

The cryotron circuit of FIG. 1 is formed by vacuum metalizing techniques onto, for example, a glass substrate 23 over which has been deposited a ground plane 25 of hard superconductive material and a thin layer 27 of dielectric material, e.g. SiO. Superconductive materials, forming strip conductors 1 and 3 and each control and gate conductor 15 and 17 and also dielectric film 19 are deposited through appropriate masking arrangements and in selected sequence such that the gate conductor of each cryotron is sandwiched between the corresponding control conductor and the ground plane. Ground plane 25 serves as a magnetic shield to reduce inductance and to eliminate high fields from the edges of the control and gate conductors 15 and 17 whereby current is more uniformly distributed thereacross and the critical current of gate conductors 17 is increased. While illustrated schematically, the gate and control conductors forming each cryotron are of equal width and in perfect registration.

Current normally divides between parallel strip conductors 1 and 3 in a ratio inversely proportional to the resistances included therein. When resistance is introduced segmentally along one of the strip conductors 1 and 3, the other strip conductor being resistanceless, the resistance ratio is infinite and all current is diverted along the other strip conductor and continues to flow therealong albeit the one strip conductor subsequently reverts to a resistanceless state. Current continues to flow along one or the other of the strip conductors 1 and 3 as no energy is available to induce a switching or dividing of the current therebetween at this time. Therefore, the operation of the cryogenic circuit arrangement of FIG. 1 is bistable, the state being defined by current flow along a particular one of the strip conductors 1 and 3.

Stability of operation may be understood if one attributes inertia to the current flowing along a particular resistanceless current path. While each of the parallel strip conductors 1 and 3 are resistanceless, inertia of the current already flowing along one strip conductor tends to keep the current flowing therealong in preference to the other; such operation is stable until resistance is introduced along the one strip conductor by switching the gate conductor 17 of an input cryotron included therein from the superconductive of the resistive state. As such time, resistance of the gate conductor along the one strip conductor causes current to flow entirely along the other strip conductor which is now resistanceless. The circuit of FIG. 1, therefore, is switched, for example, between opposite binary states by energizing control conductor 15 of a storage cryotron to destroy superconductivity in the associated gate conductor 17.

The state of the circuit arrangement of FIG. 1 is sensed by sensing cryotrons 11 and 13. As shown, segments of strip conductors 1 and 3 form the control conductors 15 of sensing cryotrons 11 and 13, respectively. Therefore, when current flow is along one or the other of the strip conductors 1 and 3, control conductor 15 of storage cryotron 11 or 13, respectively, is energized to generate critical fields to destroy superconductivity along the associated gate conductor 17. Accordingly, the state of the circcuit arrangement of FIG. 1 can be determined by sensing the state, i.e. either resistive or superconductive, of either or both of gate conductors 17 or sensing cryotrons 11 and 13, respectively. Since current gain is not realized in inline cryotron as illustrated in FIG. 1, a bias conductor, not shown, formed of a thin film of soft superconductive materials is registered with control conductor 15 and gate conductor 17 of each sensing cryotron 11 and 13. A constant current of predetermined magnitude is directed along each biasing conductor to generate continuous magnetic fields to augment magnetic fields generated by current flow along conductors 1 and 3, respectively, whereby the associated gate conductors 17 of sensing cryotrons 11 and 13, respectively, are driven resistive. Bias conductors of this type are, for example, shown and described in the copending patent application of Charles J. Bertuch et al., Ser. No. 133,528, and filed on Aug. 23, 1961.

The switching time of the circuit arrangement is defined as that time required for current to be switched between alternate strip conductors 1 and 3. The time in which current can be switched between alternate current paths of FIG. 1 is directly related to the inductance L of the cryogenic loop which is proportional to the stored energy or penetration depth λ of the gate conductor materials of input cryotrons 7 and 9, respectively, and inversely related to the normal resistance R of such gate conductor materials which is selectively introduced into one or the other of strip conductors 1 and 3 when storage cryotron 7 or 9, respectively, is operated. Accordingly, to minimize switching time, gate conductors 17 of storage cryotrons 7 and 9, respectively, should have a maximum normal resistance and a minimum penetration depth λ.

Figure 2:
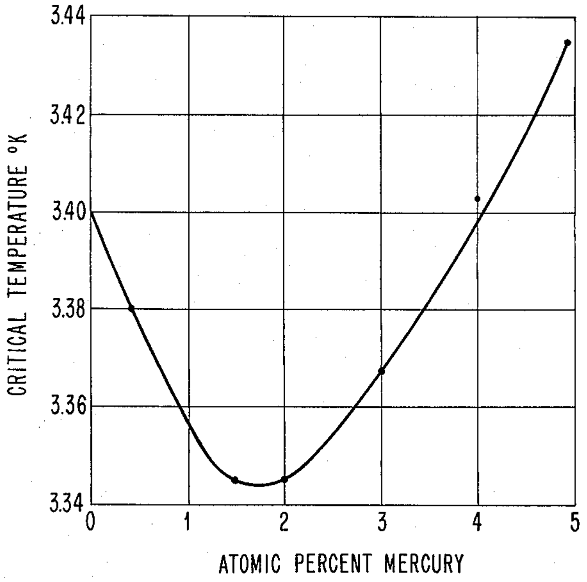
FIG. 2 depicts the characteristic critical temperature versus composition curve of the indium-mercury alloy system.

At the critical transition temperature, the resistance of a pure superconductive specimen is essentially discontinuous and there is no intermediate state where the pure superconductive material is partially superconductive and partially resistive. Superconductive alloys, however, do exhibit this intermediate state which tends to spread the transition of such specimen between superconductive and normal resistive states over a wide range of temperature or applied magnetic field. Accordingly, the switching or response time of the superconductive alloy specimen is increased. One solution to the problem of reducing the response time of superconductive alloy specimens to within tolerable limits for cryogenic applications and to provide reproducible transition characteristics has been set forth and described in the copending patent application of Morton D. Reeber, Ser. No. 192,570, which was filed May 4, 1962, and assigned to the same assignee as this invention. As described in the above-identified patent application, the switching time of a superconductive alloy is reduced when such specimen is substantially homogeneous so as to minimize variations in critical temperature between microscopic portions thereof and solute concentration is particularly selected so as to minimize the slope of the critical temperature versus composition curve. The critical temperature versus composition curve of the indium-mercury alloy system identical to that given in the above-identified Reeber patent application is illustrated in FIG. 2. When the slope of the curve of FIG. 2 approaches zero at less than 2% mercury-solute concentration, therefore, the intermediate state is minimized and transition sharpness comparable to that of pure monatomic specimens is achieved.

In accordance with the principles of this invention, however, the switching time of the circuit arrangement of FIG. 1 is substantially reduced when the cryotrons coupled therealong, i.e. cryotrons 7, 9, 11, and 13, are of the thin film type and wherein the gate conductors are formed of a selected alloy system, e.g. primary solid solutions of indium. As hereinabove indicated, it has generally been accepted that the penetration depth λ and also the normal resistance of a superconductive alloy increase substantially linearly as a function of increased solute concentration. A resultant proportional increase in penetration depth λ gives rise to increased inductive effects which would negate the advantages of increased resistance of a gate conductor due to alloying. Accordingly, the switching time of a cryogenic loop would not be increased. In accordance with this invention, however, particular alloy systems, e.g. the indium-base primary solid solutions, can be selected which when formed as thin films exhibit a substantial increase in normal resistance with only a minor accompanying increase in penetration depth λ. Such alloy systems are particularly selected to have a large $\rho l$ constant, i.e. $\rho l=K$, $\rho$ designating the normal resistivity of the metal at temperatures slightly in excess of the critical temperature and $l$ designating mean free path. As the $\rho l$ constant of a primary solid solution alloy is that of the pure alloy-base metal, alloy systems can be selected in accordance with the characteristics of the base metal. One such alloy system which has been thoroughly investigated is the indium-base alloy system and this invention is described with respect thereto.

The penetration depth λ is a fundamental length or reference which defines the size of a specimen in which size-dependent properties will be present. The penetration of a magnetic field into a metal specimen capable of exhibiting superconductivity but in the normal resistance state is essentially infinite; however, while superconductive, such a specimen is essentially diamagnetic whereby magnetic fields are excluded along all but a small surface portion defined as the penetration depth λ. The exclusion of magnetic fields from a superconducting metal specimen is termed the Meissner effect.

Current theory, for example, as described by Pippard, suggests that the penetration depth λ of a superconductive alloy increases as the normal state resistivity of the particular alloy system increases. For example, Pippard in his experiments on tin-base alloys, as reported in the Proceedings of the Royal Society (London), A216, 547 (1943) concluded that the increase in penetration depth λ with increased resistivity due to alloying results from a decrease in the mean free path $l$ due to impurity scattering. It has been observed, however, that alloy systems having a large $\rho l$ constant, e.g. indium-base alloys, when formed as thin films exhibit a much smaller increase in penetration depth with increasing resistivity than observed by Pippard. It should be clearly understood, however, that the proportionately smaller increase in penetration depth λ as compared with that of resistance due to alloying is characteristic of thin films of the alloy material; accordingly, and in accordance with this invention, the gate conductors of cryotrons 7, 9, 11 and 13 of FIG. 1 should be formed of thin films having a thickness of about 10,000 A., e.g. within a same order of magnitude as the penetration depth λ. Introduction of a solute to increase resistivity does not appear to reduce the mean free path $l$ of the aforementioned alloy system significantly when the superconductive specimen is in the form of a thin film; rather, such specimens show only a modest increase in penetration depth λ (and critical field) for a given increase in resistivity on alloying.

Figure 3:
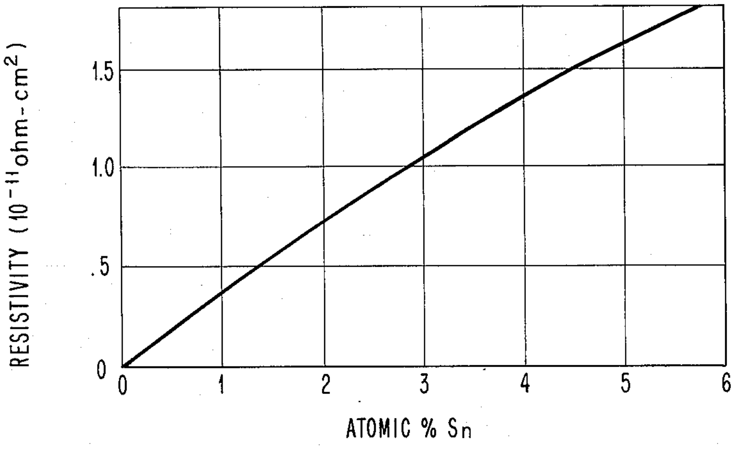
FIG. 3 is a plot of resistivity $\rho$ as a function of percentage composition of the indium-tin alloy system.

It has been observed that thin films of indium-base alloys exhibit only a modest increase in penetration depth λ (and, therefore, critical field) for a given increase in resistivity due to alloying. While the penetration depth λ increases as a function of increased resistivity, i.e. percentage of solute, the rate of increase of penetration depth λ (and, therefore, stored energy) is much less than if a thin film gate conductor were formed of a different alloy-base material having a smaller $\rho l$ constant. As illustrated in FIG. 3, resistivity exhibited by a thin film formed of an alloy of the indium-tin system increases linearly as a function of solute concentration. In accordance with the reported work of Pippard (Proceedings of the Royal Society (London), A216, 547 (1953)) and also of P. B. Miller (Physical Review, 113, 1209 (1959)) on tin-base alloys, the resultant increase in penetration depth λ with increased solute concentration is inversely related to the electronic mean free path $l$ and is due to impurity scattering. Impurity scattering generally accompanies an alloying process and accounts for the greater resistivity exhibited by an alloy over that exhibited individually by the solvent and solute metals. It is to be clearly understood, however, that the principles of this invention are not inconsistent with the results of Pippard and Miller; the resultant reduction in mean free path of indium-base alloys when formed as thin films is, however, much smaller than would normally be expected; the resultant increase in penetration depth λ is slight, i.e. about 35%, larger than that of pure indium for an alloy containing 6 atomic percent tin.

Figure 4:
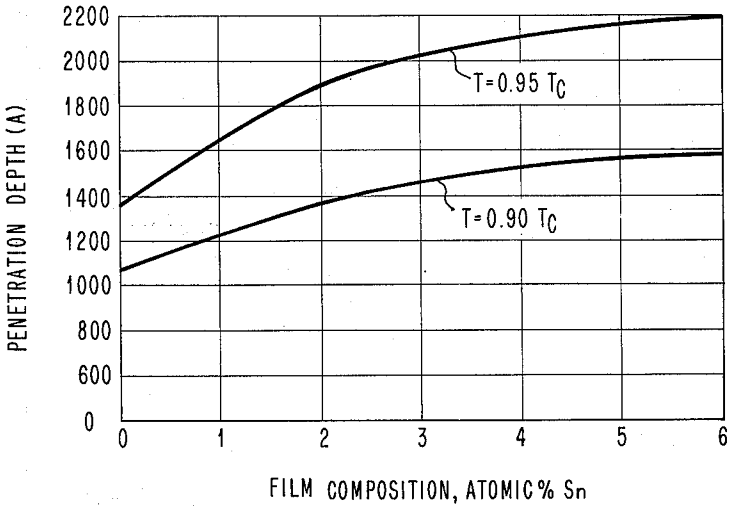
FIG. 4 is a plot of penetration depth λ as a function of percentage composition of the indium-tin alloy system at 0.90 and also 0.95 of the critical transition temperature $T_c$.

Referring to FIGS. 4 and 5, resistivity and penetration depth λ at $0.90T_c$ and also $0.95T_c$, respectively, are plotted as a function of the percentage composition of the indium-tin system. It is to be noted that increased resistivity due to alloying varies as a substantially linear function of percentage composition. On the other hand, the penetration depth λ, while temperature dependent, does not increase linearly as a function of percentage composition; rather, the rate of change becomes less and approaches zero as the percentage composition is increased up to 6% tin, the limit of the primary solid solution. There is no substantial increase in penetration depth $\lambda$ for percentage compositions in excess of about 2%. Accordingly, the rate of change in penetration depth $\lambda$ is very much less than the rate of change in resistivity as a function of percentage composition. As illustrated in FIGS. 3 and 4, the penetration depth increases only approximately 35% while the resistivity of the thin film specimen is increased by 1000% to 1200% for the complete range of solid solution of the indium-tin alloy.

From the discussion hereinabove set forth, it is evident that the switching time constant $L/R$ of a cryogenic circuit, for example, as shown in FIG. 1 is substantially reduced when the thin film gate conductors are formed of superconductive alloys having a large $\rho l$ constant, hereinafter designated K. Therefore, for a particular value of resistivity $\rho$, the mean free path $l$ is proportional to the constant K. As penetration depth $\lambda$ varies inversely as the electronic mean free path $l$ with increase in solute concentration, the rate of change of penetration depth $\lambda$ with increased solute concentration is at a minimum, i.e. small increase in penetration depth $\lambda$ for a given increase in resistivity $\rho$, when the constant K is large. Therefore, when gate conductors 17 of cryotrons, 7, 9, 11, and 13 are formed of thin films of such alloys, the switching time constant $L/R$ of the circuit arrangement of FIG. 1 is substantially reduced whereby increased switching speeds are achieved with only a very modest increase in the value of the required critical fields.

While the physical phenomenon can only be theorized, it is believed that these advantages are due to the particular crystal structure ofthe indium-base alloy films and the orientation of these films on their substrates. As is generally known, the constant K of a bulk specimen, i.e. the product of resistivity $\rho$ and mean free path $l$, of a given material, e.g. indium, is relatively insensitive to the direction of current flow relative to the crystal orientation. When alloys are formed in the solid solution range, the indium solvent plus the alloying solute are in a single phase and the resulting crystal structure is that of the alloy-base metal, i.e. indium; in a bulk specimen of an indium base alloy, the different crystallites may or may not have different orientations. In a thin film, where surface effects are important, however, electrons moving at different angles to the surface of such films contribute differently to the total current flow therealong, i.e. only a limit zone of the Fermi surface is effective in determining the electronic properties. When the orientation of the crystal axes of a thin film is such that a large number of electrons are traveling at small angles to the surfaces of the film, i.e. when the effective zone of the Fermi surface has a large radius of curvature, the apparent D.-C. conductivity is high. Thus, the constant K of a thin film depends not only upon the composition of the film but also upon the particular orientation of the crystal axes of the film relative to the substrate surface. When deposited as a thin film, however, indium and the indium-base alloys exhibit a very strong, preferred orientation with the (101) planes of the body centered tetragonal cell parallel to the surface of a substrate; this preferred orientation accounts for the large $\rho l$ constant exhibited by indium alloy thin films, i.e. for this orientation, the effective zone of the Fermi surface possesses a small radius of curvature. Therefore, the slower rate of change of penetration depth $\lambda$ with respect to that of resistivity as a function of solute concentration exhibited by indium-base alloys is due to the particular electronic properties of these dilute alloys together with the particular orientation of their crystal axes relative to the substrate surface.

It has been established on experimental and theoretical grounds, that increase in penetration depth $\lambda$ with increase in solute concentration is inversely related to the electronic mean free path $l$. Each metal and also its dilute alloys can be characterized by the product of resistivity $\rho$ and mean free path $l$ which, at cryogenic operating temperatures, is a constant, i.e. $\rho l=K$ or $(l^{-1}/\rho)=1/K$. Thus, the rate of increase of penetration depth with increased resistivity is given by $\delta\lambda/\lambda\rho=\delta\lambda/\delta(l^{-1})\cdot\delta(l^{-1})/\delta\rho$. Since the term $\delta\lambda/\delta(l^{-1})$ is similar for various superconductive metals and since $\delta(l^{-1})/\delta\rho=1/K$, the rate of change of penetration depth $\lambda$ as a function of resistivity $\rho$ with increased solute concentration is minimized when the constant K of the superconductive alloy is large.

The constant K for various metals and their alloys have been investigated. For example, P. N. Dheer, Proceedings of the Royal Society (London), A260, 333 (1961), has reported the constant K for bulk indium specimens as $0.57\times10^{-11}$ ohm-cm.$^2$; also, Chambers, in his above-identified article, has reported the constant K for bulk tin as $1.05\times10^{-11}$ ohm-cm.$^2$. Chambers has also reported the constant K for numerous other metals in his article. However, in measurements made on thin films of indium and indium-tin alloys, the constant K has been observed as equal to $2.0\pm0.5\times10^{-11}$ ohm-cm.$^2$. The constant K for indium-base alloy films, therefore, is considerably larger than those reported for bulk specimens of both indium and tin. In addition to the indium-tin films, investigations have also been made of indium-base alloys with lead, gallium, cadmium, and thallium as solutes. As the orientation of the crystal axes of a dilute solution is essentially that of the alloy-base metal, each of these alloys when formed as a thin film exhibits substantially the same constant K as does the indium-tin system and may be used for cryogenic applications with similar beneficial results. Also, it is evident that other superconductive alloy systems exhibiting a large constant K provide similar advantages when employed in cryogenic applications.

While the invention has been particularly shown and described with reference to preferred embodiments thereof, it will be understood by those skilled in the art that various changes in form and details may be made therein without departing from the spirit and scope of the invention.

What is claimed is:

1. A superconductive circuit element including a control conductor arranged in magnetic field applying relationship to a gate conductor, said gate conductor being formed as a thin film so as to exhibit size dependent properties and consisting essentially of a superconductive alloy having a solute concentration at least in excess of that defined at the minimum excursion of the critical temperature versus composition curve of said superconductive alloy, said superconductive alloy exhibiting a $\rho l$ constant not less than $1.5\times10^{-11}$ ohm-cm.$^2$.

2. A superconductive circuit element as defined in claim 1 wherein said superconductive alloy exhibits a $\rho l$ constant not less than $2.0\times10^{-11}$ ohm-cm.$^2$.

3. A superconductive circuit element including a control conductor arranged in magnetic field applying relationship to a gate conductor, said gate conductor being formed of a thin film so as to exhibit size dependent properties and consisting essentially of a superconductive alloy having a solute concentration such that the absolute value of the slope of the critical temperature versus composition curve is greater than zero, said superconductive alloy exhibiting a $\rho l$ constant not less than $1.5\times10^{-11}$ ohm-cm.$^2$.

4. A superconductive circuit element as defined in claim 3 wherein said superconductive alloy exhibits a $\rho l$ constant not less than $2.0\times10^{-11}$ ohm-cm.$^2$.

5. A superconductive circuit element including a control conductor arranged in magnetic field applying relationship to a gate conductor, said gate conductor being formed in a thin film of substantially 10,000 A. and consisting essentially of a superconductive alloy having a solute concentration in excess of that defined at the minimum excursion of the critical temperature versus composition curve of said superconductive alloy, said superconductive alloy exhibiting a $\rho l$ constant not less than that of an indium-base alloy system.

6. A superconductive circuit element including a control conductor arranged in magnetic field applying relationship to a gate conductor, said gate conductor being formed in a thin film so as to exhibit size dependent properties and consisting essentially of a superconductive alloy, said superconductive alloy having a solute concentration such that the slope of the critical temperature versus composition curve is greater than zero and exhibiting a $\rho l$ constant not less than that of an indium-base alloy system.

7. A superconductive cryotron comprising a control conductor in magnetic field applying relationship to a gate conductor, said gate conductor consisting of a thin film of a primary solid solution indium-base alloy having a solute concentration at least in excess of that defined at the minimum excursion of the characteristic critical temperature versus composition curve of said alloy and wherein the solute is selected from the group consisting of tin, lead, gallium, cadmium, and thallium.

8. A cryotron comprising a control conductor arranged in magnetic field applying relationship with a gate conductor, said gate conductor being characterized as formed of a thin film of a primary solid solution indium-tin alloy and being of a thickness so as to exhibit size dependent properties, said tin solute being at least in excess of that concentration defined at the minimum excursion of the critical temperature versus composition curve of said indium-tin alloy.

9. A cryotron comprising a control conductor arranged in magnetic field applying relationship with a gate conductor, said gate conductor being characterized as formed of a thin film of a primary solid solution indium-lead alloy and being of a thickness so as to exhibit size dependent properties, said lead solute being at least in excess of that concentration defined at the minimum excursion of the critical temperature versus composition curve of said indium-lead alloy.

10. A cryotron comprising a control conductor arranged in magnetic field applying relationship with a gate conductor, said gate conductor being characterized as formed of a thin film of a primary solid solution indium-gallium alloy and being of a thickness so as to exhibit size dependent properties, said gallium solute being at least in excess of that concentration defined at the minimum excursion of the critical temperature versus composition curve of said indium-gallium alloy.

11. A cryotron comprising a control conductor arranged in magnetic field applying relationship with a gate conductor, said gate conductor being characterized as formed of a thin film of a primary solid solution indium-cadmium alloy and being of a thickness so as to exhibit size dependent properties, said cadmium solute being at least in excess of that concentration defined at the minimum excursion of the critical temperature versus composition curve of said indium-cadmium alloy.

12. A cryotron comprising a control conductor arranged in magnetic field applying relationship with a gate conductor, said gate conductor being characterized as formed of a thin film of a primary solid solution indium-thallium alloy and being of a thickness so as to exhibit size dependent properties, said thallium solute being at least in excess of that concentration defined at the minimum excursion of the critical temperature versus composition curve of said indium-thallium alloy.

13. A cryotron comprising a control conductor arranged in magnetic field applying relationship with a gate conductor, said gate conductor being characterized as formed of a thin film of a primary solution indium-mercury alloy and being of a thickness to exhibit size dependent properties, said mercury solute being at least in excess of that concentration defined at the minimum excursion of the critical temperature versus composition curve of said indium-mercury alloy.

References Cited by the Examiner

UNITED STATES PATENTS

| | | | |
|---|---|---|---|
| 2,983,889 | 5/61 | Green | 338—32 |
| 2,989,714 | 6/61 | Park et al. | 338—32 |
| 2,989,716 | 6/61 | Brennemann et al. | 338—32 |

RICHARD M. WOOD, *Primary Examiner.*